United States Patent
Yokota

(10) Patent No.: US 10,224,395 B2
(45) Date of Patent: Mar. 5, 2019

(54) SEMICONDUCTOR DEVICE AND ITS MANUFACTURING METHOD

(71) Applicant: RENESAS ELECTRONICS CORPORATION, Tokyo (JP)

(72) Inventor: Kazuki Yokota, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/648,814

(22) Filed: Jul. 13, 2017

(65) Prior Publication Data
US 2018/0019303 A1    Jan. 18, 2018

(30) Foreign Application Priority Data

Jul. 14, 2016  (JP) .................................. 2016-139493

(51) Int. Cl.
| | |
|---|---|
| *H01L 29/06* | (2006.01) |
| *H01L 21/762* | (2006.01) |
| *H01L 23/535* | (2006.01) |
| *H01L 21/768* | (2006.01) |

(52) U.S. Cl.
CPC .... *H01L 29/0649* (2013.01); *H01L 21/76224* (2013.01); *H01L 21/76877* (2013.01); *H01L 23/535* (2013.01)

(58) Field of Classification Search
CPC ... H01L 29/06; H01L 29/0649; H01L 21/762; H01L 21/768; H01L 23/535
See application file for complete search history.

(56) References Cited

U.S. PATENT DOCUMENTS

| | | | |
|---|---|---|---|
| 8,692,352 B2 * | 4/2014 | Onishi ................. | H01L 21/764 257/397 |
| 2009/0272982 A1* | 11/2009 | Nakamura ........ | H01L 29/66068 257/77 |
| 2011/0062547 A1* | 3/2011 | Onishi ................. | H01L 21/764 257/510 |
| 2011/0175205 A1* | 7/2011 | Morii ................. | H01L 21/76232 257/618 |

FOREIGN PATENT DOCUMENTS

JP      2013-222838 A      10/2013

* cited by examiner

*Primary Examiner* — Fazli Erdem
(74) *Attorney, Agent, or Firm* — McDermott Will & Emery LLP

(57) ABSTRACT

In an element isolation region defining an element formation region, there is formed an element isolation unit including an element isolation unit and the other element isolation unit. The other element isolation unit is arranged in a direction intersecting a direction in which the element isolation unit extends from the element isolation unit. The element isolation unit includes a sidewall oxide film formed in a trench, a titanium film, a titanium nitride film, and a tungsten film. The tungsten film is formed to cover the bottom surface of a trench in the element isolation unit and to close an opening end of a trench in the other element isolation unit. A plug is formed in contact with the tungsten film of the element isolation unit.

6 Claims, 18 Drawing Sheets

SEMICONDUCTOR DEVICE AND ITS MANUFACTURING METHOD

CROSS-REFERENCE TO RELATED APPLICATIONS

The disclosure of Japanese Patent Application No. 2016-139493 filed on Jul. 14, 2016 including the specification, drawings and abstract is incorporated herein by reference in its entirety.

The present invention relates to a semiconductor device and a manufacturing method therefor, and is preferably applicable to a semiconductor device including, for example, a deep isolation structure.

BACKGROUND

Semiconductor devices have an element isolation structure having a deep trench applied thereto, as a structure for electrically isolating semiconductor elements formed on a semiconductor substrate. This element isolation structure is called a DTI (Deep Trench Isolation). Japanese Unexamined. Patent Application Publication No. 2013-222838 discloses an example of this DTI.

This element isolation structure has an element isolation unit in a form where a conductor unit for fixing the semiconductor substrate at a predetermined potential is formed. In this element isolation unit, there is formed the conductor unit through an intervening sidewall insulating film, interposed therebetween, on the side wall of the deep trench. The conductor unit is formed in contact with the semiconductor substrate on the bottom surface of the deep trench. A tungsten film is formed also in the deep trench, as the conductor unit. A contact unit (plug) for applying a predetermined potential to the tungsten is formed.

SUMMARY

In the semiconductor device, the tungsten film needs to be deposited on the bottom of the deep trench. Thus, the wider the width of the trench, the easier the tungsten film is formed on the bottom surface of the deep trench. However, the wider the width of the trench, the easier a gap is formed in the deep trench. In a following process, the gap may be exposed. Therefore, to form a contact part away from the exposed gap, it is necessary to form additionally a lead-out electrode which is electrically coupled to the tungsten film embedded in the deep trench.

Other objects and new features will be apparent from the descriptions of the present specification and the accompanying drawings.

According to one embodiment, there is provided a semiconductor device comprising a semiconductor substrate, an element isolation unit, an element formation region, an insulating film, and a contact unit. The element isolation unit is formed in the semiconductor substrate. The element formation region is defined by the element isolation unit. The insulating film is formed to cover the element formation region. The contact unit penetrates through the insulating film and is formed in contact with the element isolation unit. The element isolation unit includes a first element isolation unit and a second element isolation unit. The first element isolation unit reaches a first depth from a surface of the semiconductor substrate, and has a first width. The second element isolation unit reaches the first depth from the surface of the semiconductor substrate, and has a second width narrower than the first width. The first element isolation unit includes a first conductor unit which is electrically coupled to the semiconductor substrate at a lower end of the first element isolation unit. The second element isolation unit includes a second conductor unit in contact with the first conductor unit. The contact unit is in contact with the second conductor unit.

According to another embodiment, there is provided a method of manufacturing a semiconductor device, comprising the following steps. There are formed a first trench reaching a first depth from a surface of a semiconductor substrate and having a first width and a second trench having a second width narrower than the first width. There is formed a sidewall insulating film covering a sidewall surface of each of the first trench and the second trench and for exposing a part the semiconductor substrate positioned on a bottom surface of each of the first trench and the second trench. There is formed a conductive film through the intervening sidewall insulating film in the first trench and the second trench. There is formed a first conductor unit through the intervening sidewall insulating film in the first trench, and there is formed a second conductor unit through the intervening sidewall insulating film in the second trench, by performing an etch back process for the conductive film and removing a part of the conductive film positioned above an upper surface of the semiconductor substrate while remaining a part of the conductive film positioned in each of the first trench and the second trench. There is formed an insulating film to cover the first conductor unit and the second conductor unit. There is formed a contact hole for exposing the second conductor unit in the insulating film. There is formed a contact unit in contact with the second conductor unit in the contact hole.

According to the semiconductor device according to one embodiment, there is no need to additionally form the lead-out electrode.

According to the manufacturing method of manufacturing a semiconductor device, according to another embodiment, it is possible to skip a process for additionally forming the lead-out electrode.

DETAILED DESCRIPTION

Embodiment 1

Figure 1:
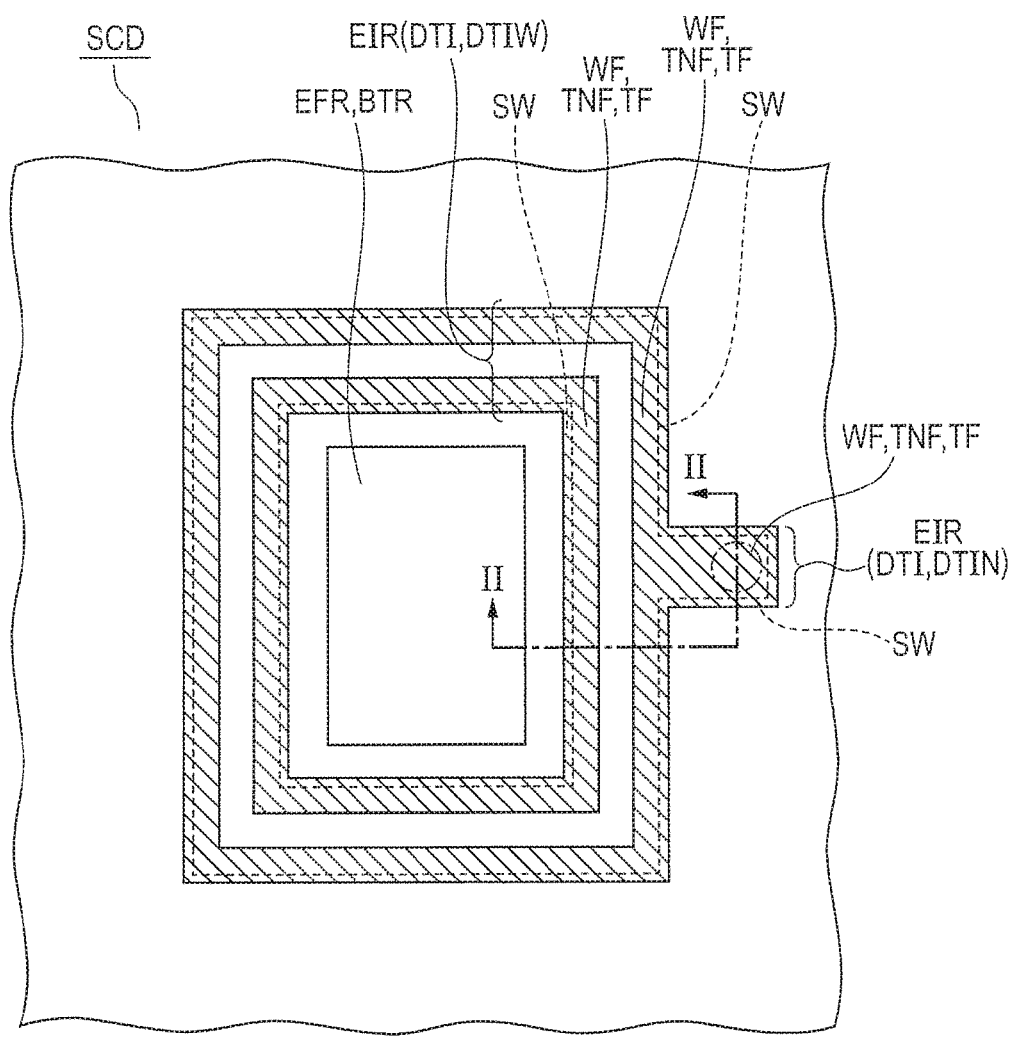
FIG. 1 is one plan view of a semiconductor device according to an embodiment 1.
Figure 2:
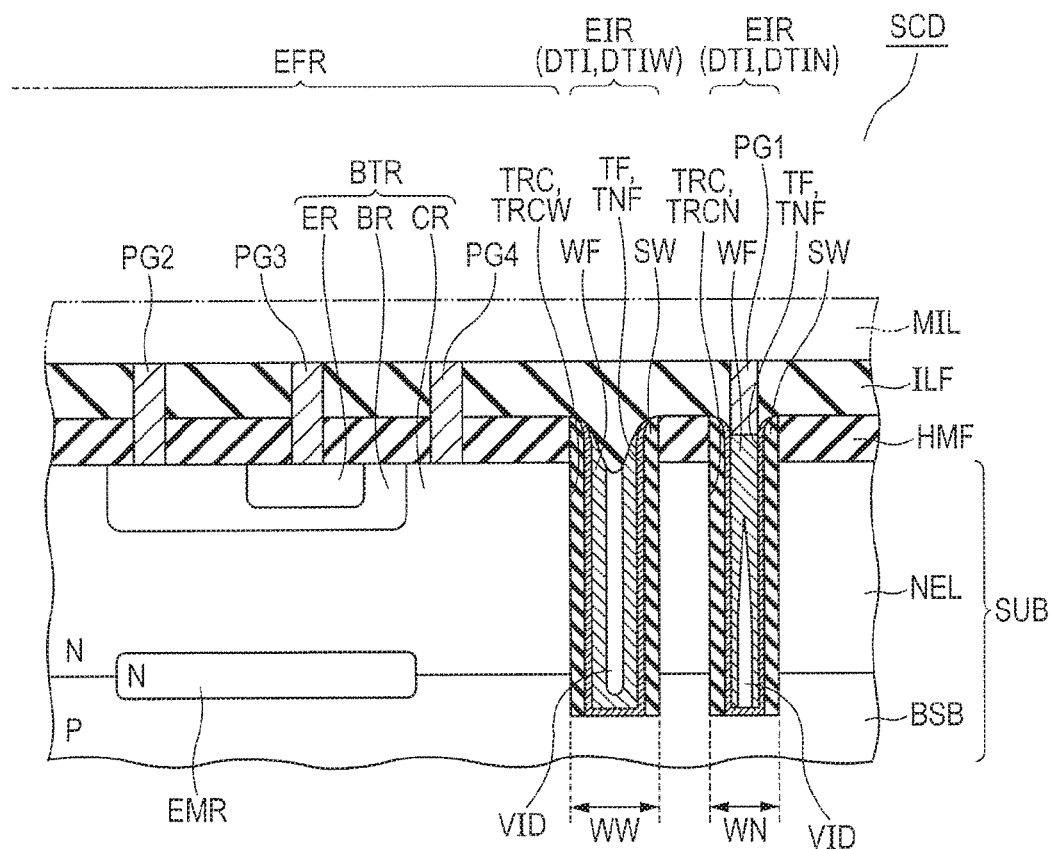
FIG. 2 is a cross sectional view taken along a line II-II illustrated in FIG. 1, in the same embodiment.

Descriptions will now be made to a semiconductor device according to an embodiment 1. As illustrated in FIG. 1 and FIG. 2, on a semiconductor substrate SUB, an element formation region EFR is defined, by an element isolation region EIR. In the element formation region EFR, for example, a bipolar transistor BTR is formed, as an example of a semiconductor element. The bipolar transistor BTR includes an emitter ER, a collector lager CR, and a base layer BR.

The semiconductor substrate SUB includes a P-type silicon substrate BSB and an N-type epitaxial layer NEL. The N-type epitaxial layer NEL is formed in contact with the surface of the silicon substrate BSB. An N-type embedded layer EMR is formed between the silicon substrate BSB and the N-type epitaxial layer NEL. The emitter layer ER, the collector layer CR, and the base layer BR are formed in the N-type epitaxial layer NEL.

An element isolation unit DTI is formed in the element isolation region EIR. The element isolation unit DTI includes an element isolation unit DTIW and an element isolation unit DTIN. The element isolation unit DTIW penetrates through a silicon oxide film HMF, and is formed in a trench TRCW reaching a predetermined depth from the surface of the semiconductor substrate SUB. The element isolation unit DTIN penetrates through the silicon oxide film HMF, and is formed in a trench TRCN reaching a predetermined depth of approximately 15 μm from the surface of the semiconductor substrate SUB.

The trench TRCW has a width WW. The trench TRCN has a width WN. The width WW is set wider than the width WN. The width WW is, for example, approximately 2 μm. The width WN is, for example, approximately 0.8 to 1.5 μm. The depth of the trench TRC to the width of the trench TRC is called an aspect ratio. In the trench TRCW, the aspect ratio is approximately 7.5. In the trench TRCN, the aspect ratio is approximately 10 to 18.75. The aspect ratio of the trench TRC is equal to or greater than 7.5. That is, the aspect ratio of the element isolation unit DTI formed in the trench TRC is equal to or greater than 7.5.

The element isolation unit DTIW is arranged to surround the element formation region EFR. The element isolation unit DTIN is arranged in a direction intersecting a direction in which the element isolation unit DTIW extends from the element isolation unit DTIW.

The element isolation unit DTIW includes a sidewall oxide film SW, a titanium film TF, a titanium nitride film TNF, and a tungsten film WF. The sidewall oxide film SW is formed to cover the side wall of the trench TRCW. The titanium film TF, the titanium nitride film TNF, and the tungsten film WF are formed in contact with the bottom surface of the sidewall oxide film SW and the trench TRCW. In the trench TRCW having a wide width WW, a gap VID may be generated in a state where the tungsten film WF is formed.

The element isolation unit DTIN includes a sidewall oxide film SW, a titanium film TF, a titanium nitride film TNF, and a tungsten film WF. In the trench TRCN having a narrow width WN, a gap VID may be generated near the bottom surface of the trench TRCW, in a state where the tungsten film WF is formed. However, at the opening end of the trench TRCN, the tungsten film WE is formed to close the opening end of the trench TRCN.

The titanium film TF, the titanium nitride film TNF, the tungsten film WF formed in the trench TRCW, and the titanium film TF, the titanium nitride film TNF, the tungsten film WF formed in the trench TRCN are coupled in the trench TRC, and are electrically coupled (see FIG. 1).

The interlayer insulating film ILF is formed to cover the bipolar transistor BTR, the element isolation units DTIW and DTIN. To penetrate through the interlayer insulating film ILF, plugs PG1, PG2, PG3, and PG4 are formed. The plug PG1 is in contact with the tungsten film WE of the element isolation unit DTIN. The plug PG2 is in contact with the source layer SR. The plug PG3 is in contact with the emitter layer ER. The plug PG4 is in contact with the collector layer CR. Particularly, the plug PG1 is arranged to overlap the element isolation unit DTIN in plan view.

Above the interlayer insulating film ILF, a multilayer wiring structure MIL including a plurality of wiring layers and interlayer insulating films for insulating between the plurality of wiring layers. The semiconductor device according to the embodiment 1 is configured as described above.

Figure 3:
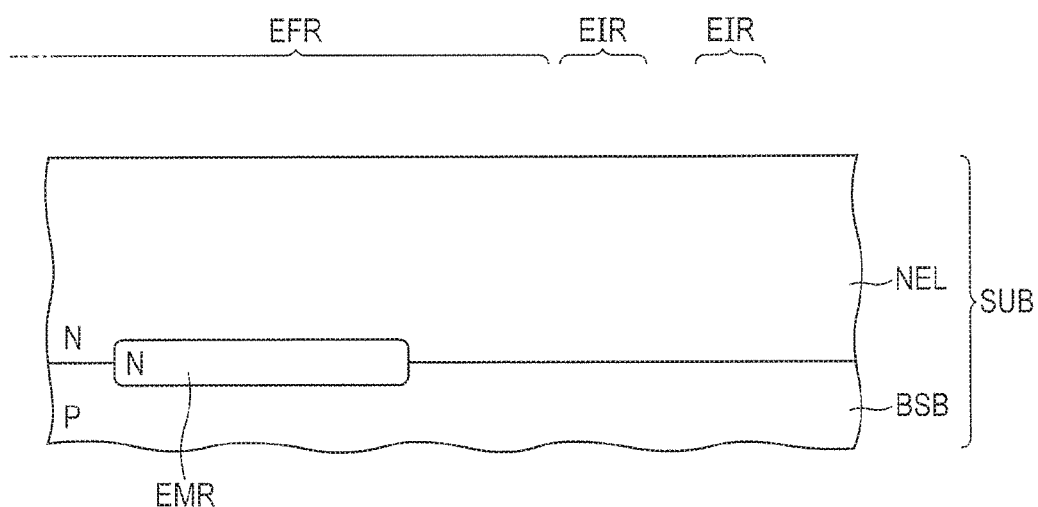
FIG. 3 is a cross sectional view showing one process of a method of manufacturing a semiconductor device, in the same embodiment.

Descriptions will now be made to an example of a method of manufacturing the above-described semiconductor device. As illustrated in FIG. 3, first, a semiconductor substrate SUB is prepared. In the semiconductor substrate SUB, an N-type epitaxial layer NEL is formed on the P-type semiconductor substrate BSB. A P-type embedded layer EMR is formed between the silicon substrate BSB and the N-type epitaxial layer NEL.

Figure 4:
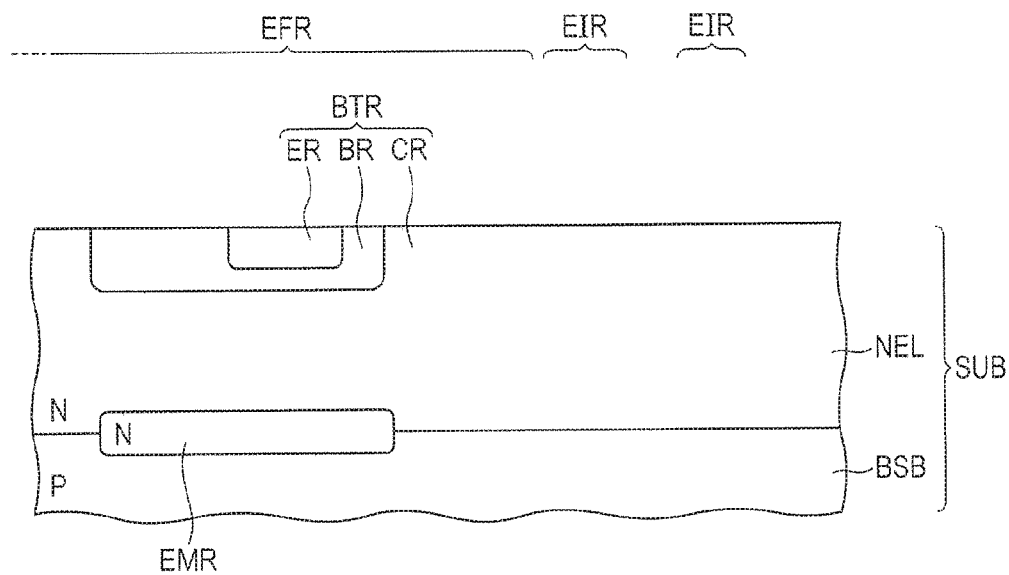
FIG. 4 is a cross sectional view showing a process performed after the process illustrated in FIG. 3, in the same embodiment.

A bipolar transistor is formed in a region as the element formation region EFR. As illustrated in FIG. 4, the base layer BR and the emitter layer ER are formed by injecting predetermined conductive impurities into the N-type epitaxial layer NEL. The N-type epitaxial layer NEL will be the collector layer CR. In this manner, a bipolar transistor BTR having the base layer BR, the emitter layer ER, and the collector layer CR is formed.

Figure 5:
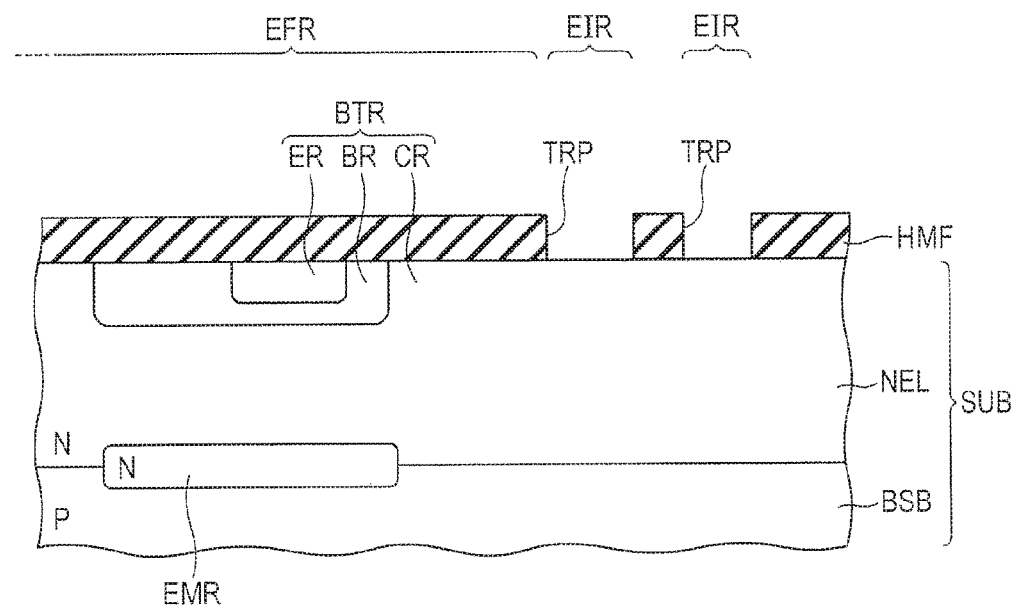
FIG. 5 is a cross sectional view showing a process performed after the process illustrated in FIG. 4, in the same embodiment.

Next, a hard mask for forming a trench is formed. A silicon oxide film (not illustrated) is formed to cover the semiconductor substrate SUB. Then, a predetermined photoengraving process and an etching process are performed, thereby forming the pattern of the silicon oxide film HMF to be the hard mask, as illustrated in FIG. 5. In the silicon oxide film HMF, there are formed openings TRPs for exposing the surface of the semiconductor substrate SUB which is positioned in a region where the trenches are formed.

Figure 6:
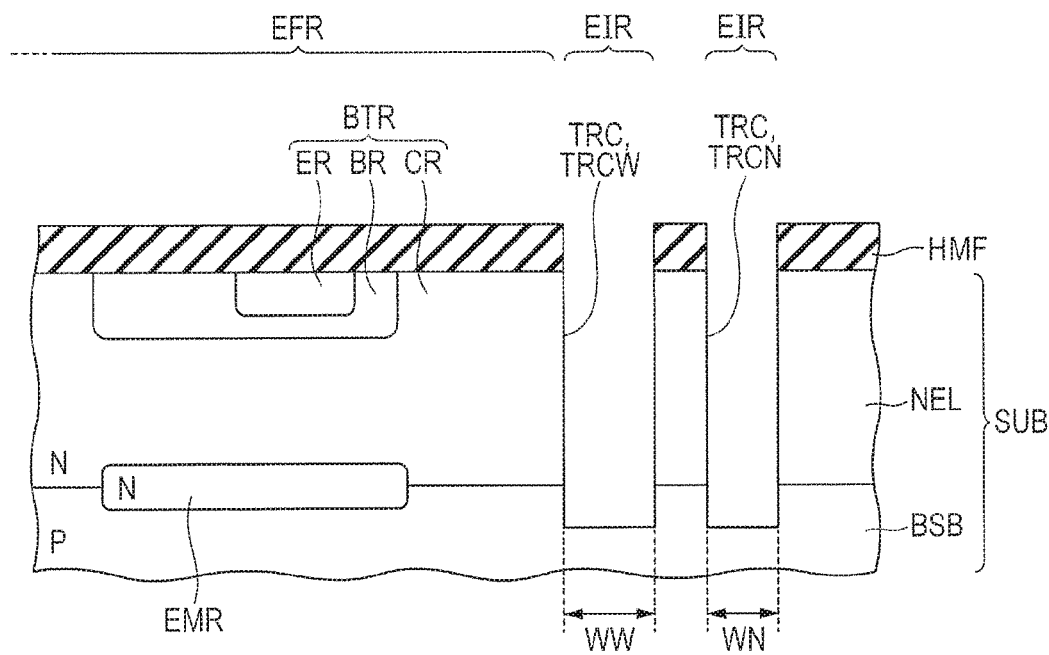
FIG. 6 is a cross sectional view showing a process performed after the process illustrated in FIG. 5, in the same embodiment.

As illustrated in FIG. 6, there are formed trenches reaching a predetermined depth from the surface of the semiconductor substrate SUB, with using the silicon oxide film HMF as an etching mask. The depth of the trench TRC is approximately, for example, 15 μm. As the trenches TRC, the trench TRCW and the trench TRCN are formed. The width WW of the trench TRCW is approximately, for example, 2.0 μm. The width WN of the trench TRCN is approximately, for example, 0.8 to 1.5 μm.

Figure 7:
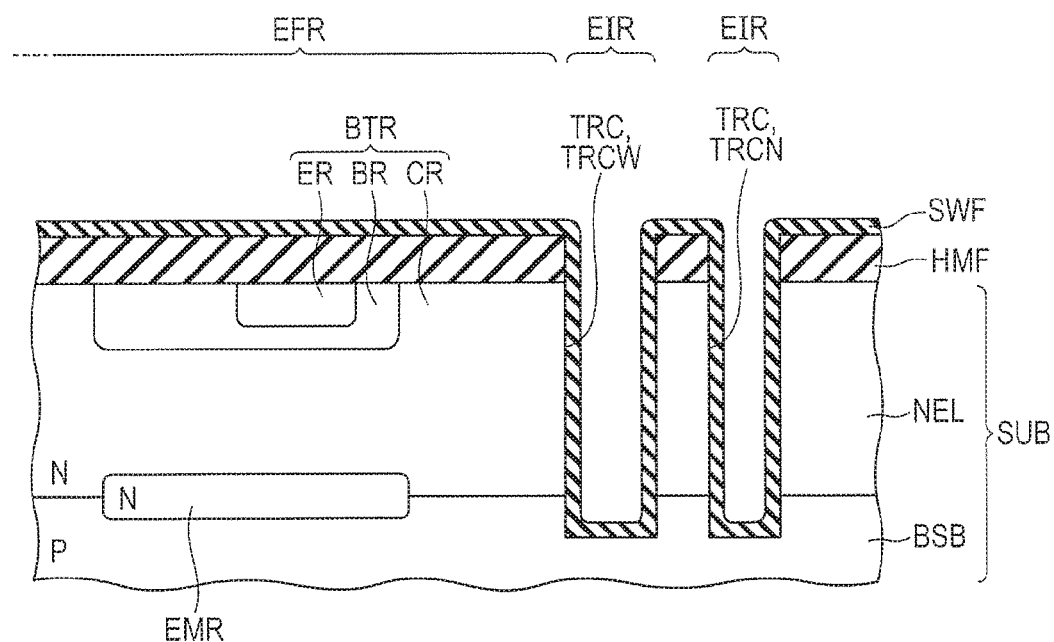
FIG. 7 is a cross sectional view showing a process performed after the process illustrated in FIG. 6, in the same embodiment.
Figure 8:
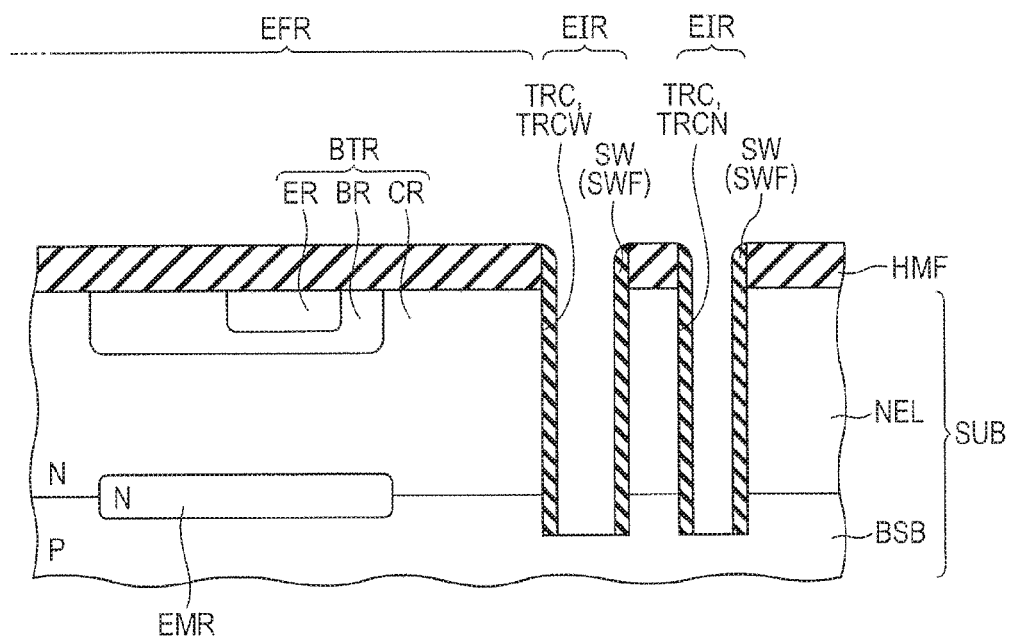
FIG. 8 is a cross sectional view showing a process performed after the process illustrated in FIG. 7, in the same embodiment.

As illustrated in FIG. 7, a silicon oxide film SWF is formed to cover the sidewall surface and the bottom surface of the trench TRC. The silicon oxide film SWF has a thickness of approximately, for example, 600 nm. As illustrated in FIG. 8, an etching process is performed for the entire surface of the silicon oxide film SWF, to remove a part positioned in the bottom surface of the trench TRC, while remaining apart positioned in the sidewall surface of the trench TRC. In this manner, the sidewall oxide film SW covering the sidewall surface of the trench TRC is formed. For example, boron (not illustrated) is injected into the bottom surface of the trench TRC.

Figure 9:
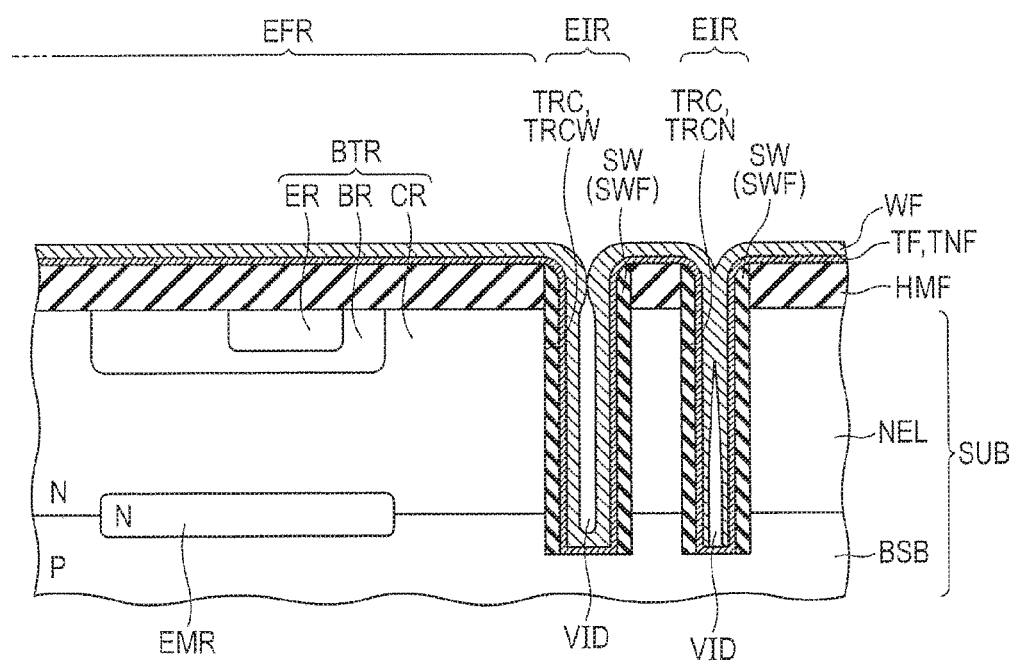
FIG. 9 is a cross sectional view showing a process performed after the process illustrated in FIG. 8, in the same embodiment.

As illustrated in FIG. 9, for example, using a CVD (Chemical Vapor Deposition) method or a sputtering method, a titanium film TF is formed, and a titanium nitride film TNF is formed to cover the titanium film TF. A tungsten film WF is formed using, for example, the CVD method, to cover the titanium nitride film TNF. The tungsten film WF has a thickness of, for example, approximately 700 to 900 mm.

In the trench TRCW having a wide width WW, the tungsten film WF is sufficiently formed on the bottom surface of the trench TRCW. In the trench TRCW, a gap VID may be generated. In the trench TRCN having a narrow width WN, the tungsten film WF is not sufficiently formed on the bottom surface of the trench TRCN, but is formed to close the opening end of the trench TRCN above the trench TRCN.

Electric coupling is made between a part of the tungsten film WF formed on the bottom surface of the trench TRCW and a part of the tungsten film WF formed to close the opening end of the trench TRCN, by a part of the tungsten film WE formed therebetween.

Figure 10:
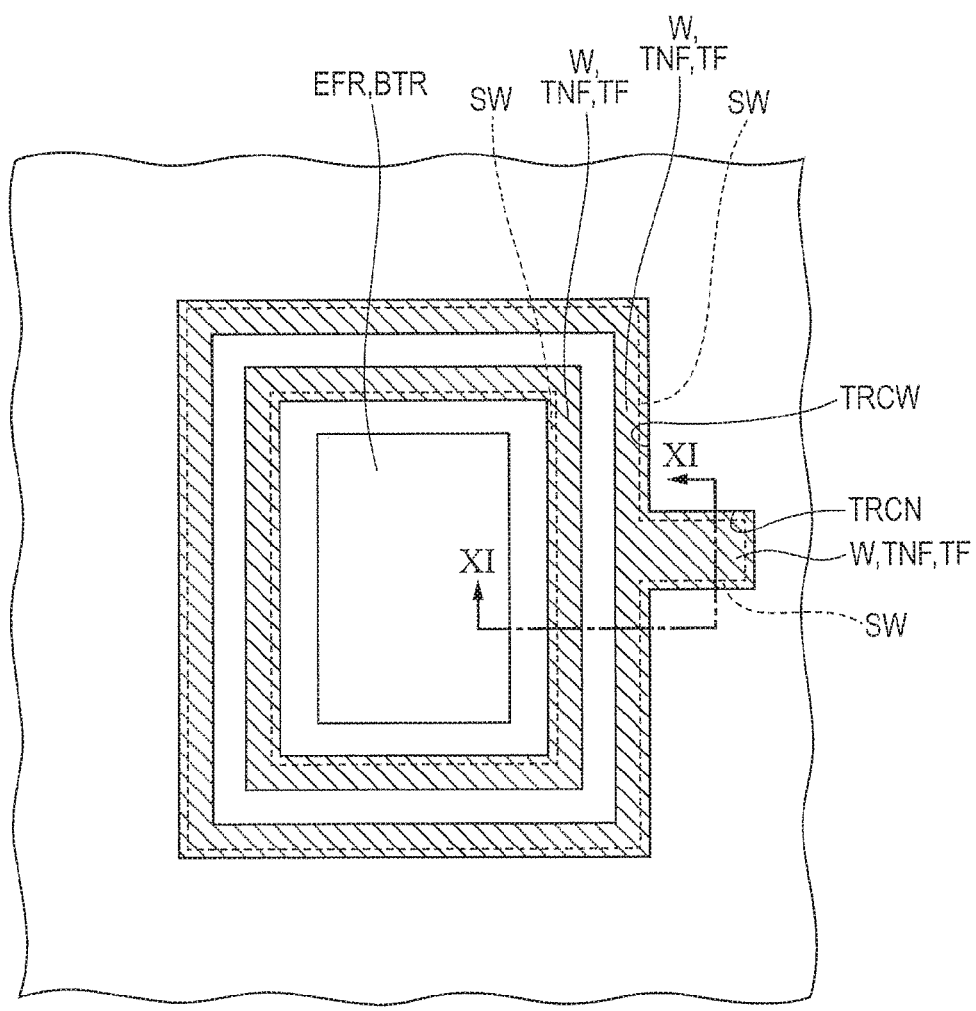
FIG. 10 is a plan view showing a process performed after the process illustrated in FIG. 9, in the same embodiment.
Figure 11:
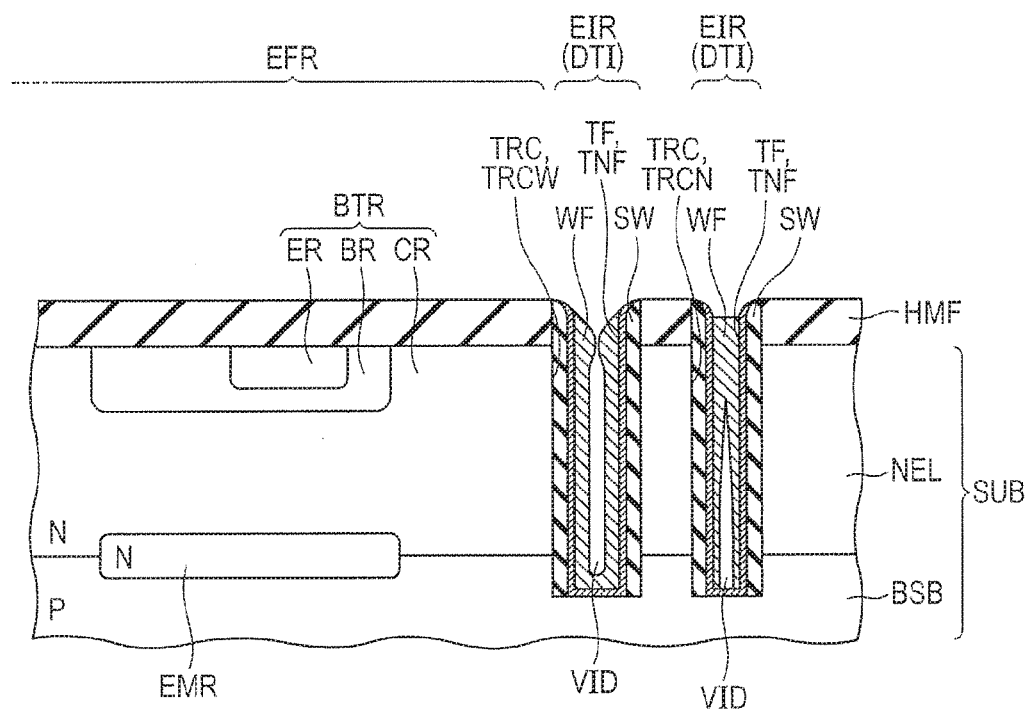
FIG. 11 is across sectional view taken along a line XI-XI illustrated in FIG. 10, in the same embodiment.

As illustrated in FIG. 10 and FIG. 11, an etching process is performed on the entire surface of the tungsten film WF, to remove the part of the tungsten film WF positioned over the upper surface of the silicon oxide film HMF, while remaining the part of the tungsten film WF positioned in the trench TRC. At this time, the tungsten film WF formed to close the opening end of the trench TRCW remains at the opening end of the trench TRCN. The gap VID generated in the trench TRCW may be exposed at the opening end of the trench TRCW. In this manner, the element isolation unit DTI is formed in the trench TRC.

Figure 12:
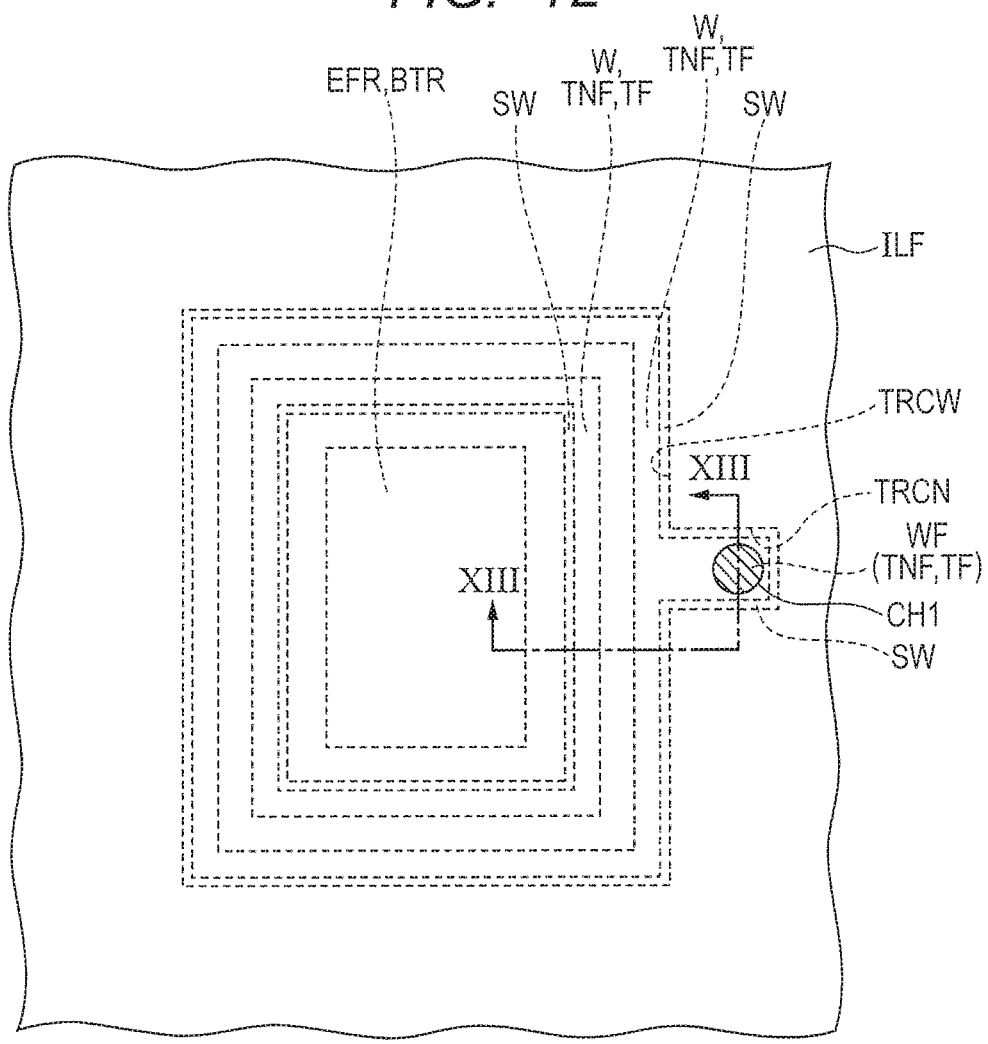
FIG. 12 is a plan view showing a process performed after the process illustrated in FIG. 10 and FIG. 11.
Figure 13:
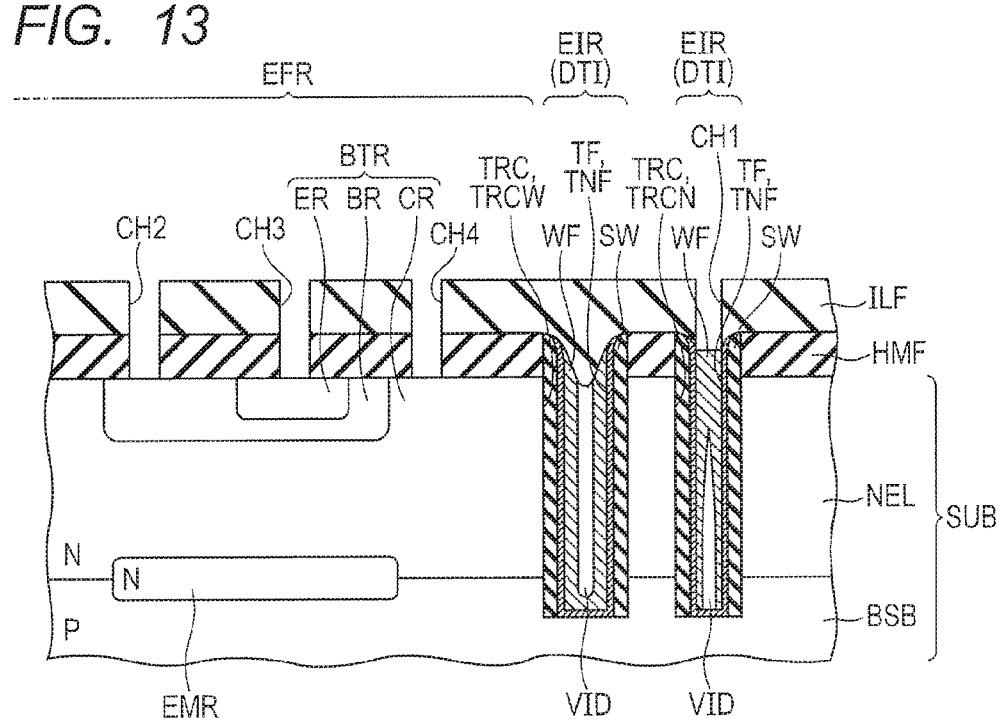
FIG. 13 is a cross sectional view taken along a line XIII-XIII illustrated in FIG. 12.

The interlayer insulating film ILF, for example, a silicon oxide film, is formed to cover the silicon oxide film HMF. Next, a predetermined photoengraving process and an etching process are performed, to form contact holes CH1, CH2, CH3, and CH4, as illustrated in FIG. 12 and FIG. 13. The tungsten film WF positioned in the element isolation unit DTIN is exposed at the bottom of the contact hole CH1. The base layer BR is exposed at the bottom of the contact hole CH2. The emitter layer ER is exposed at the bottom of the contact hole CH3. The collector layer CR is exposed at the bottom of the contact hole CH4.

Figure 14:
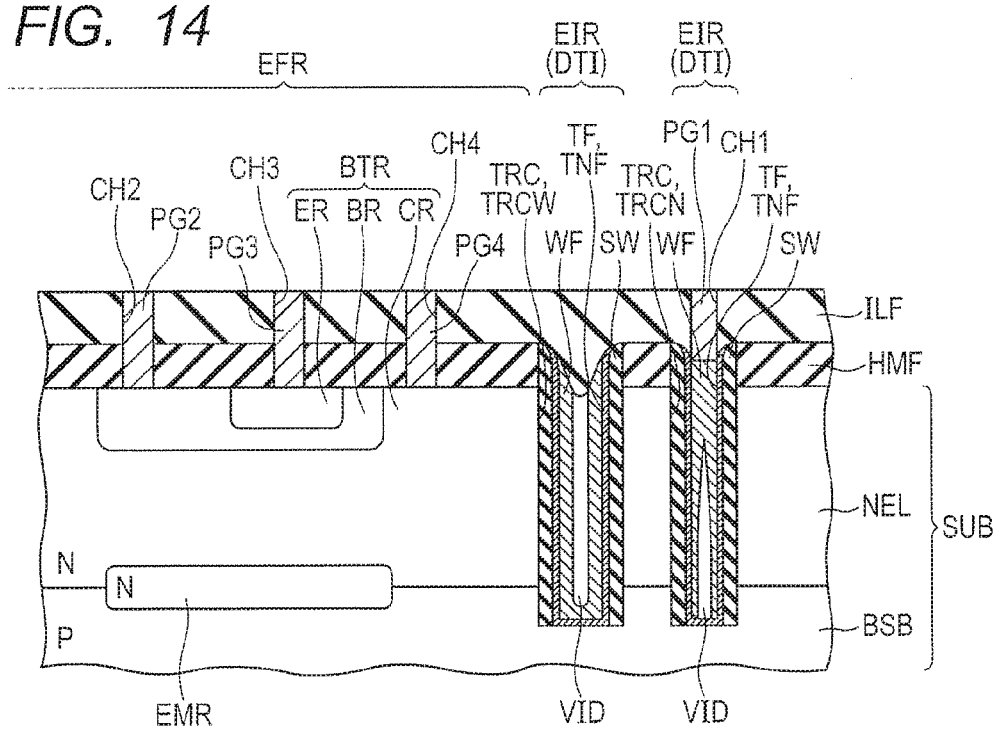
FIG. 14 is a cross sectional view showing a process performed after the process illustrated in FIG. 12 and FIG. 13.

As illustrated in FIG. 14, the plug PG1 is formed in the contact hole CH1, and the plug PG2 is formed in the contact hole CH2. The plug PG3 is formed in the contact hole CH3, and the plug PG4 is formed in the contact hole CH4. After this, by forming the multilayer wiring structure MIL, the main parts of the semiconductor device illustrated in FIG. 2 and FIG. 3 are completed.

In the above-described semiconductor device SCD, the plug PG1 for electric coupling with the semiconductor substrate SUB is formed in contact with the tungsten film WF formed to close the trench TRCN with the narrow width, thereby reducing the number of processes. This will be described as compared with a semiconductor device according to a comparative example.

Figure 15:
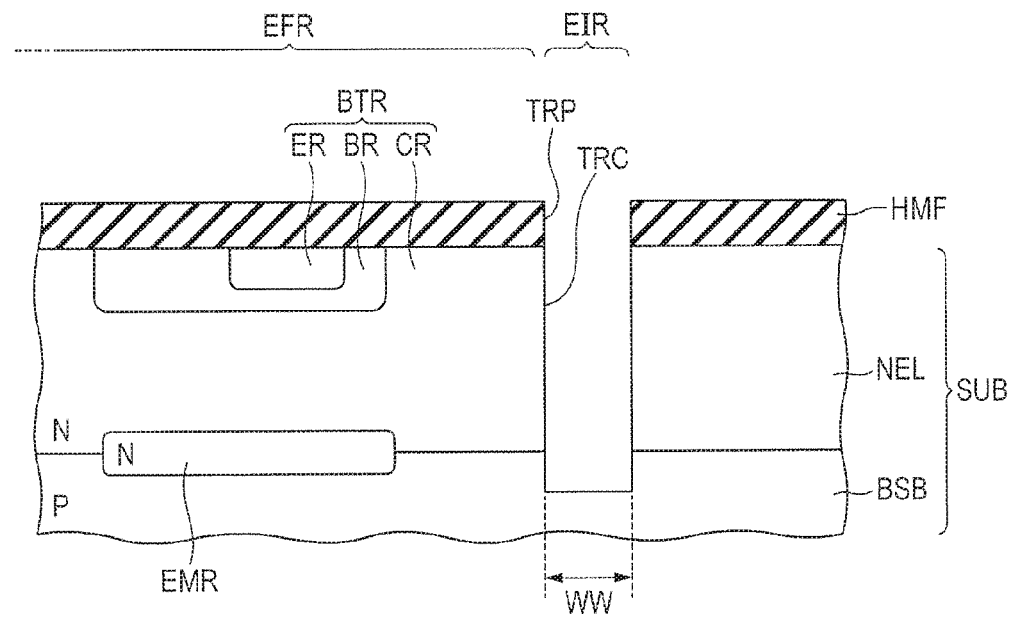
FIG. 15 is a cross sectional view showing one process of a method of manufacturing a semiconductor device according to a comparative example.

In the semiconductor device according to the comparative example, the same members as those of the semiconductor device according to the embodiment 1 are identified by the same reference symbols, and will not repeatedly be described, unless otherwise necessary. As illustrated in FIG. 15, there is formed the trench TRC reaching a predetermined depth from the surface of the semiconductor substrate SUB, while using the silicon oxide film HMF as an etching mask. The depth of the trench TRC is, for example, approximately 15 μm. The width WW of the trench TRC is approximately 2.0 μm. Only the trench TRC having this width WW is formed.

There is formed the sidewall oxide film SW (see FIG. 16) covering the sidewall surface of the trench TRC. The titanium film TF and a titanium nitride film TNF1 (see FIG. 16) are sequentially formed, to cover the sidewall oxide film SW. Next, a tungsten film WF1 (see FIG. 16) is formed to cover the titanium nitride film TNF1. The tungsten film WF1 has a thickness of, for example, approximately 700 to 900 cm.

Figure 16:
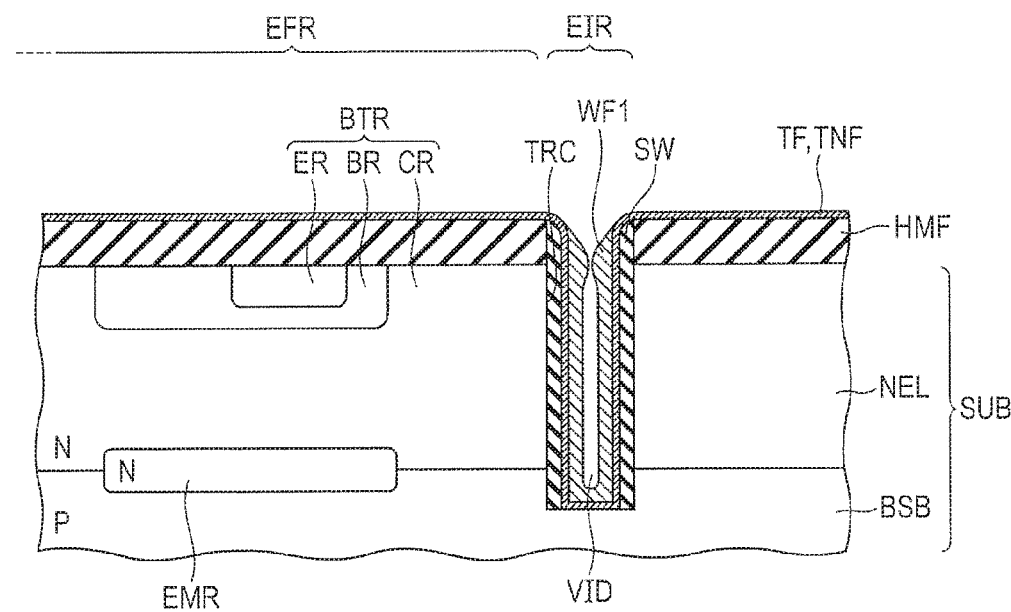
FIG. 16 is a cross sectional view showing a process performed after the process illustrated in FIG. 15.

As illustrated in FIG. 16, an etching process is performed on the entire surface of the tungsten film WF1, to remove a part of the tungsten film WF1 positioned over the upper surface of the titanium nitride film TNF1, while remaining a part of the tungsten film WF1 positioned inside the trench TRC. At this time, the gap VID generated in the trench TRCW may be exposed at the opening end of the trench TRCN.

Figure 17:
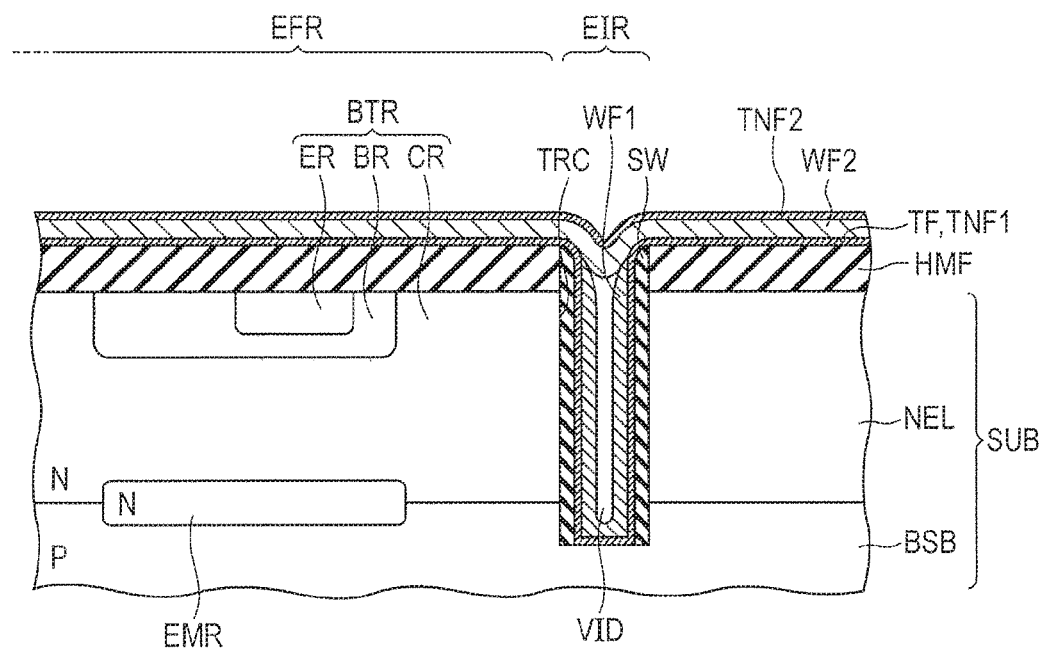
FIG. 17 is a cross sectional view showing a process performed after the process illustrated in FIG. 16.

As illustrated in FIG. 17, further, a tungsten film WF2 is formed to cover the titanium nitride film TNF. A titanium nitride film TNF2 is formed to cover the tungsten film WF2.

Figure 18:
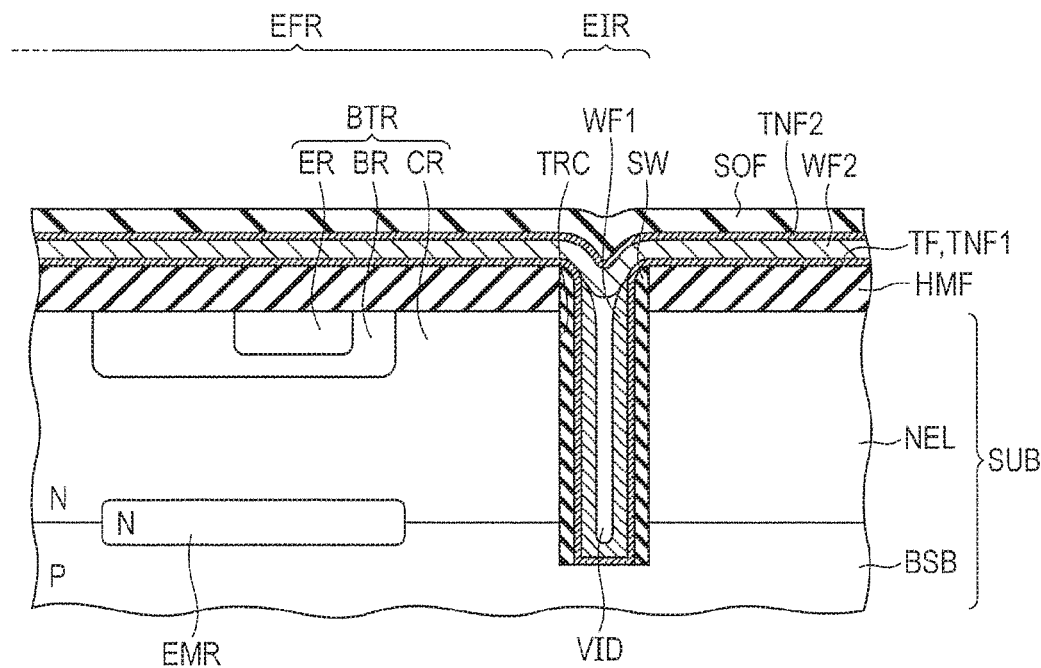
FIG. 18 is a cross sectional view showing a process performed after the process illustrated in FIG. 17.
Figure 19:
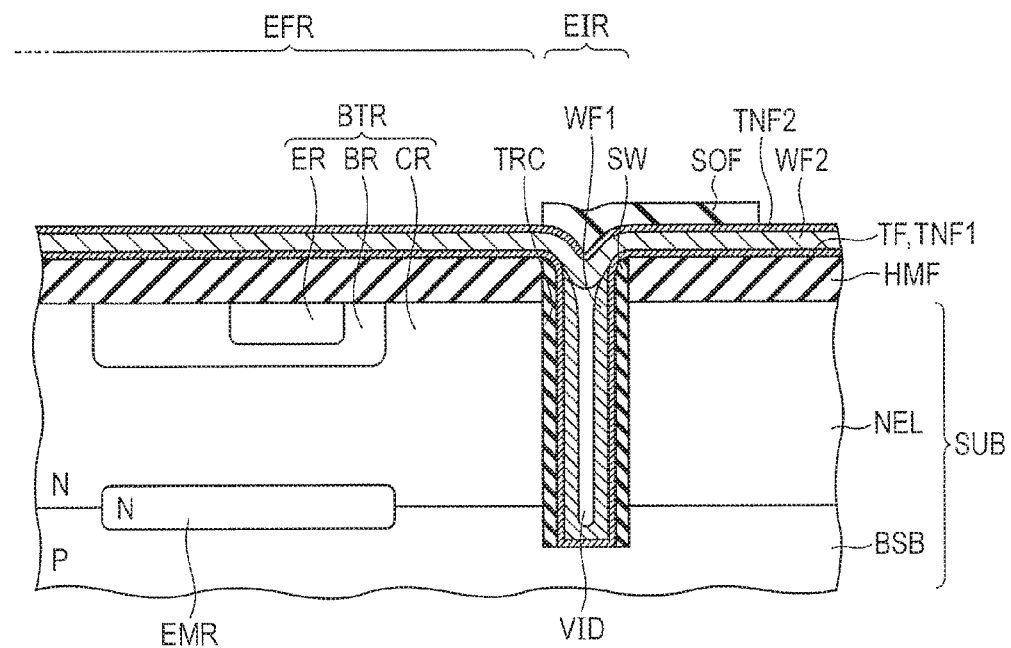
FIG. 19 is a cross sectional view showing a process performed after the process illustrated in FIG. 18.

As illustrated in FIG. 18, a silicon oxide film SOF to be a hard mask is formed to cover the titanium nitride film TNF2. Further, as illustrated in FIG. 19, by performing a predetermined photoengraving process and an etching process, the silicon oxide film SOP as the hard mask is patterned.

Figure 20:
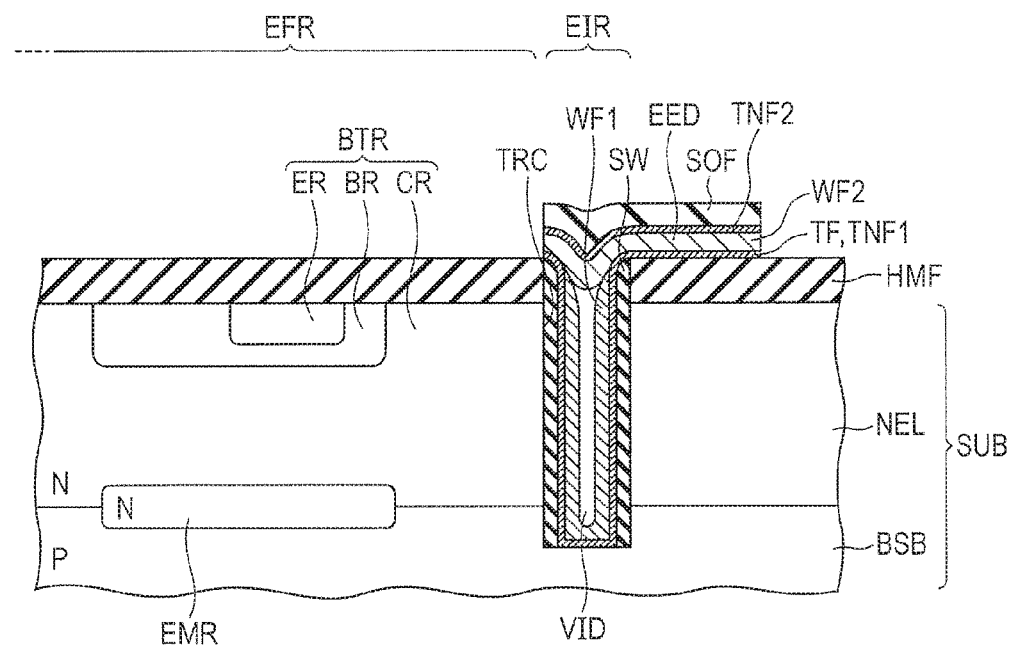
FIG. 20 is a cross sectional view showing a process performed after the process illustrated in FIG. 19.

As illustrated in FIG. 20, an anisotropic etching process is performed, while using the patterned silicon oxide film SOF as an etching mask. By so doing, the titanium nitride film TNF2, the tungsten film WF2, the titanium nitride film TNF1, and the titanium film TF are sequentially removed, thereby forming a lead-out electrode EED.

Figure 21:
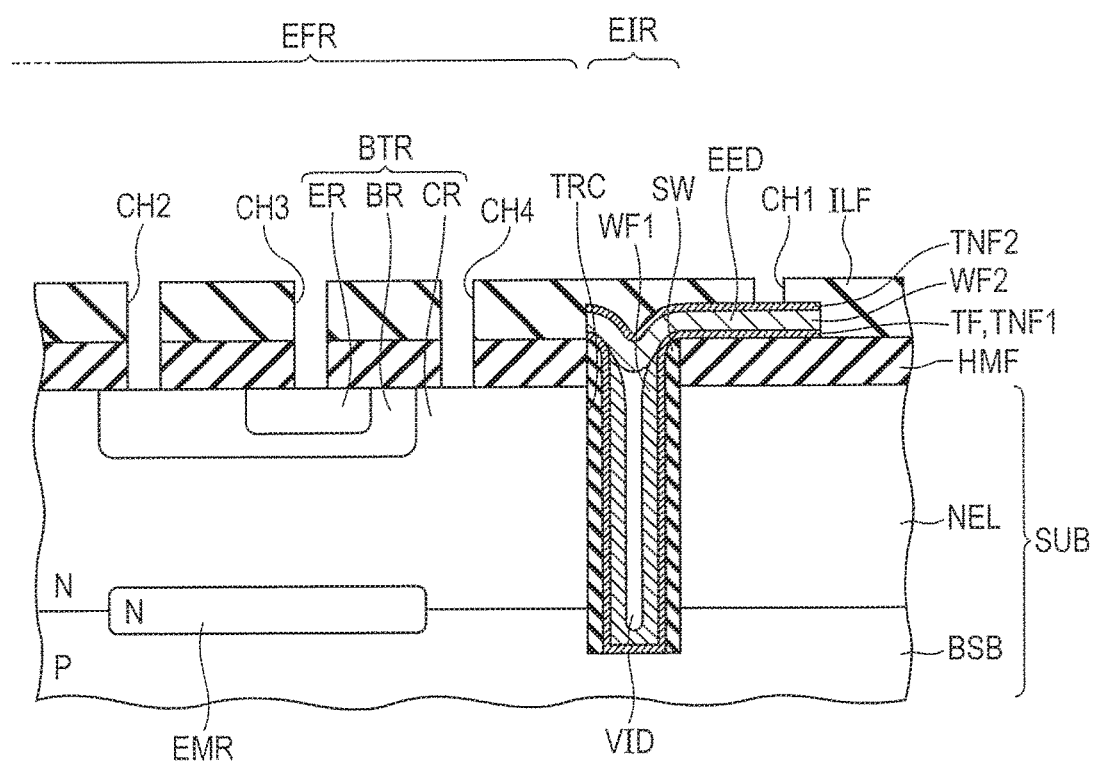
FIG. 21 is a cross sectional view showing a process performed after the process illustrated in FIG. 20.

As illustrated in FIG. 21, the interlayer insulating ILF is formed to cover the silicon oxide film HMF. Next, a predetermined photoengraving process and an etching process are performed, thereby forming the contact holes CH1, CH2, CH3, and CH4. Particularly, the titanium nitride film TNF2 is exposed at the bottom surface of the contact hole CH1.

Figure 22:
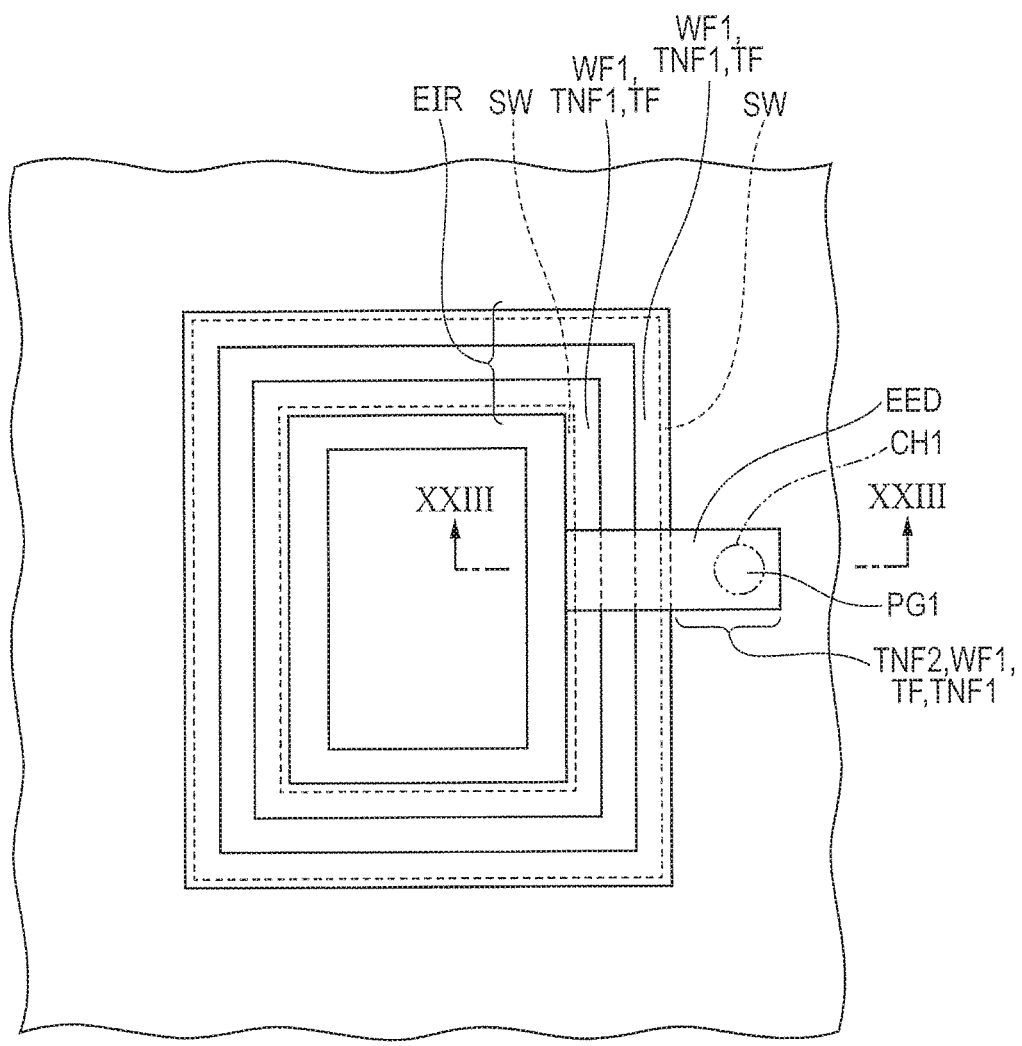
FIG. 22 is a plan view in the process illustrated in FIG. 21.
Figure 23:
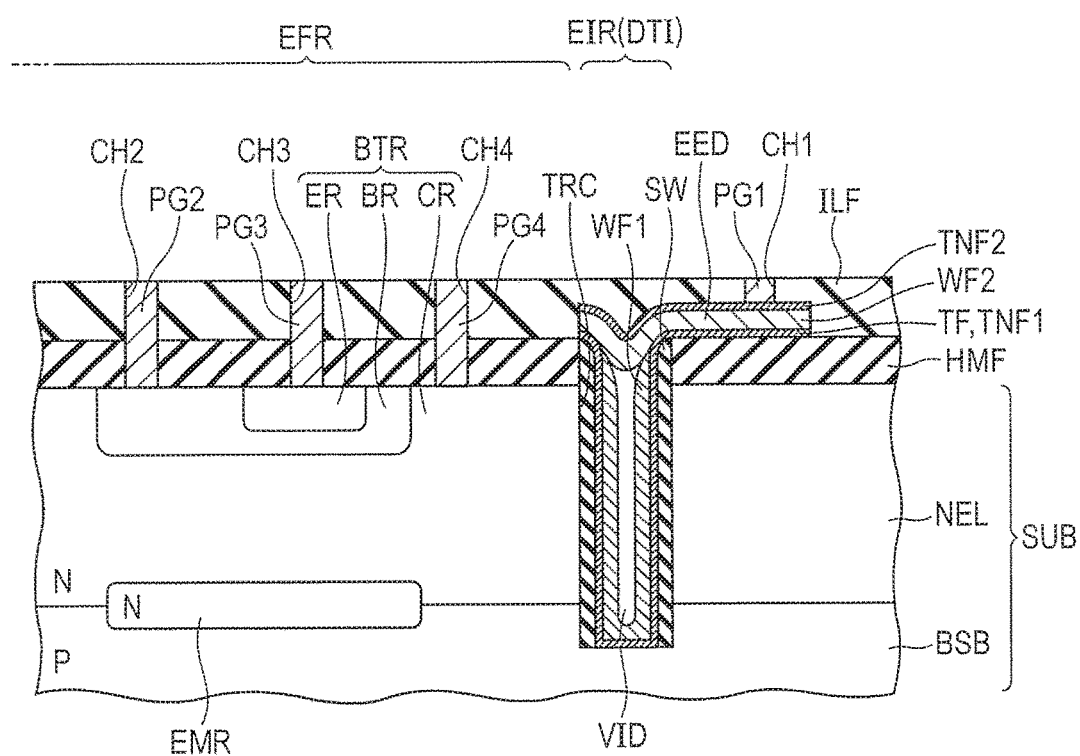
FIG. 23 is a cross sectional view showing a process performed after the process illustrated in FIG. 21 and FIG. 22.

As illustrated in FIG. 22 and FIG. 23, the plug PG1 is formed in the contact hole CH1. The plugs PG2, PG3, and PG4 are formed respectively in the contact holes CH2, CH3, and CH4. After that, by forming a multilayer wiring structure (not illustrated), the main parts of the semiconductor device according to the comparative example are completed.

In the semiconductor device according to the comparative example, as described above, at the time of performing the etching process on the entire surface of the tungsten film WF1, the gap VID generated in the trench TRCW may be exposed at the opening end of the trench TRCN. Thus, if it is intended to arrange the plug PG1 (contact hole CH1) right above the trench TRCN, electric coupling of the plug PG1 and the tungsten film WF1 may be preferably be made.

To avoid this, in the semiconductor device according to the comparative example, an additional process is necessary for forming a lead-out electrode EED, including the tungsten film WF2 and electrically coupled with the tungsten film WF1 formed in the trench TRC (processes illustrated in FIG. 17, FIG. 18, FIG. 19, and FIG. 22).

Unlike the comparative example, in the semiconductor device according to the embodiment 1, as trenches, there are formed a trench TRCW with a wide width and a trench TRCN with a narrow width. In the trench TRCN with a narrow width, the tungsten film WF is formed to close the opening end of the trench TRCN. Thus, even after an etch back process is performed for the tungsten film, it is possible to prevent that the gap generated in the trench TRCN is exposed (see FIG. 11).

The tungsten film WF formed in the trench TRCN is coupled to the tungsten film WF formed in the trench TRCW. The tungsten film WF formed in the trench TRCW is surely formed on the bottom of the trench TRCW with the wide width, and is electrically coupled to the semiconductor substrate SUB.

By forming the plug PG1 right above the tungsten film WF formed in the trench TRCN, it is possible to surely electrically couple the plug PG1 to which a predetermined potential is applied to the semiconductor substrate SUB, without forming any additional lead-out electrode.

Figure 24:
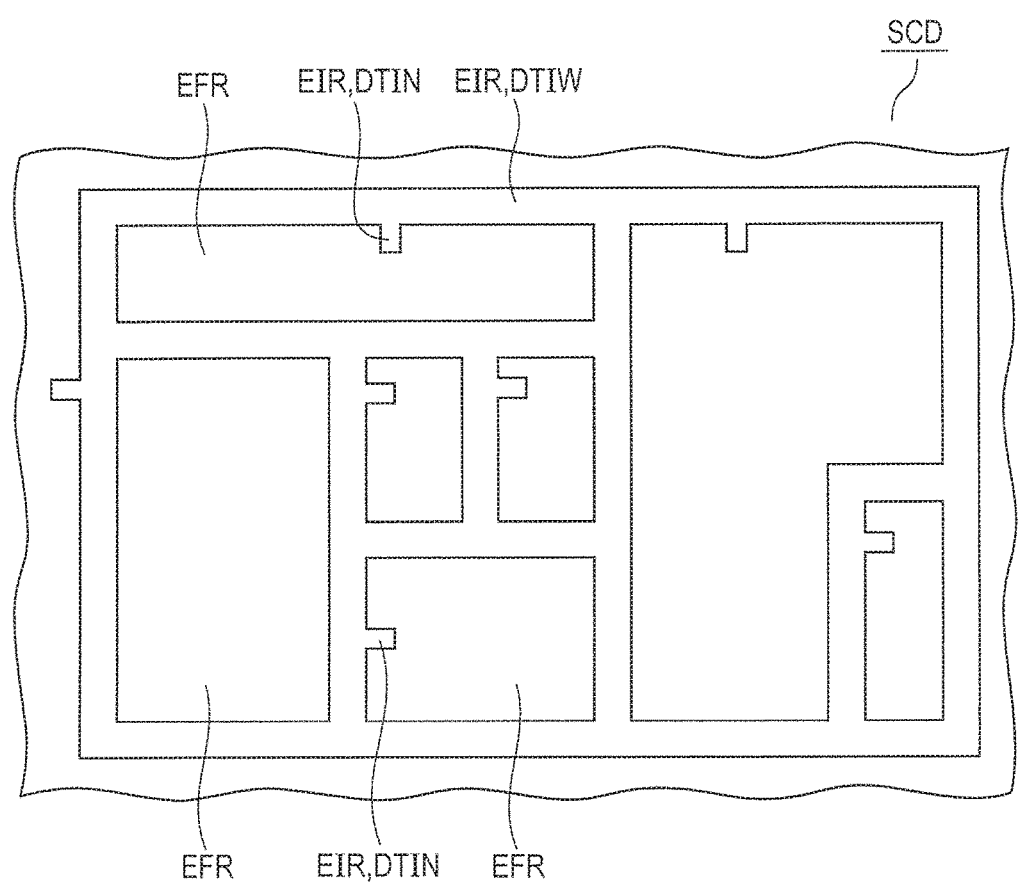
FIG. 24 is a plan view showing the variation of a plane pattern of the semiconductor device, in the same embodiment.

In the above-described semiconductor device, the descriptions have been made to the element isolation unit DTI defining one element isolation region EFR. In the semiconductor device, because a plurality of element formation regions are arranged, the element isolation unit DTI is formed in accordance with the element formation region. FIG. 24 illustrates an example of a plane pattern of the element isolation units DTI defining the element formation regions EFR. As illustrated in FIG. 24, the element isolation unit DTIN to which the plug (not illustrated) is coupled is formed in a direction intersecting a direction in which the element isolation unit DTIW defining the element formation region extends.

Embodiment 2

Descriptions will now be made to a variation of plane patterns of the element isolation units DTI. In the above-described semiconductor device, the descriptions have been made to the plane pattern in which the element isolation unit DTIN with the narrow width has been formed, in a direction intersecting the direction in which the element isolation unit DTIW with the wide width extends, by way of example.

Figure 25:
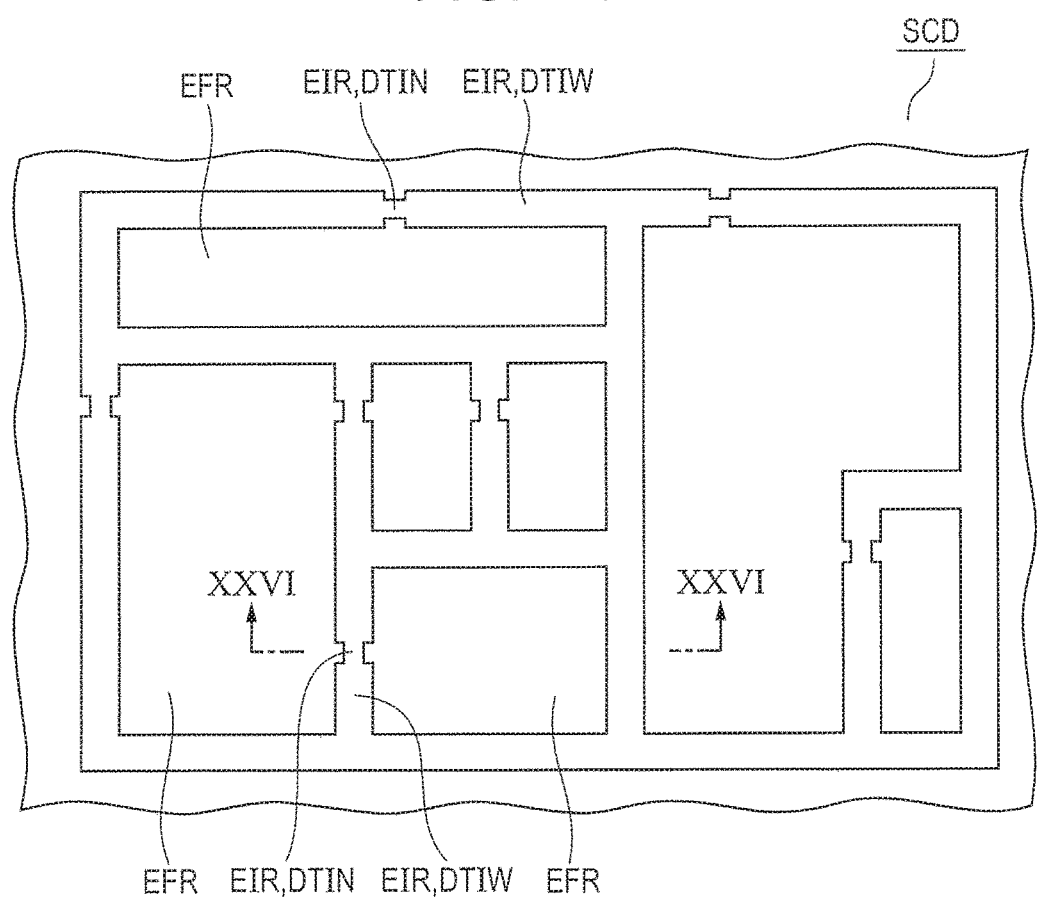
FIG. 25 is a plan view showing a plane pattern of a semiconductor device according to an embodiment 2.
Figure 26:
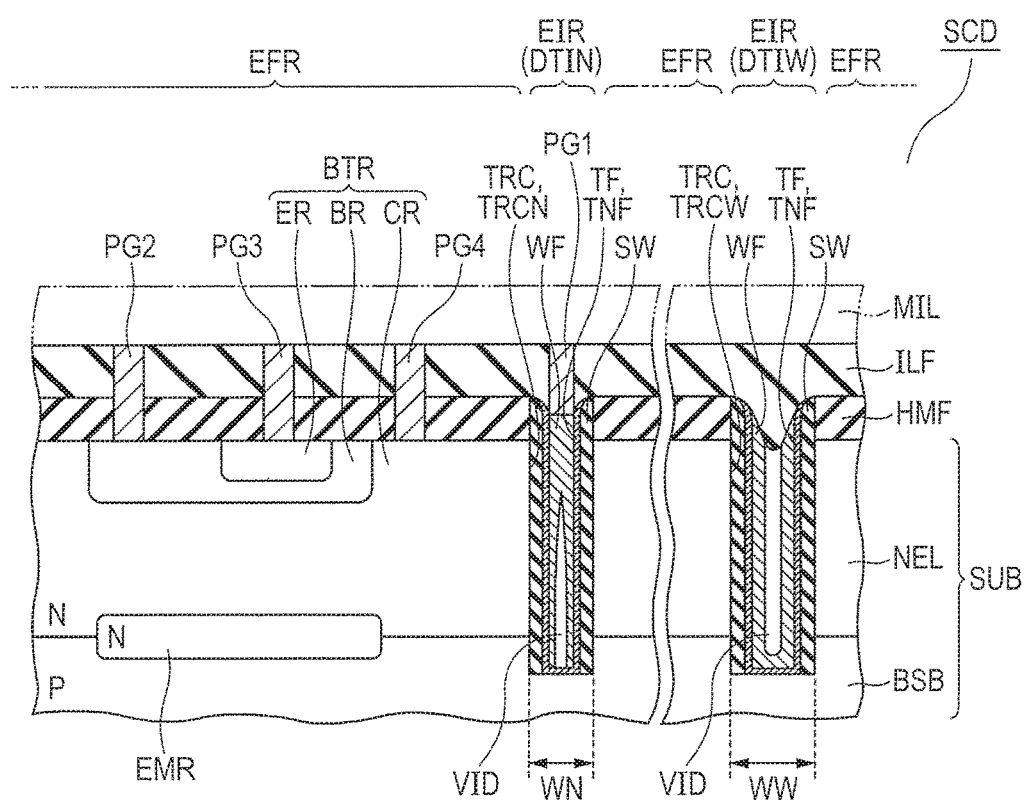
FIG. 26 is a cross sectional view taken along a line XXVI-XXVI illustrated in FIG. 25, in the same embodiment.

As illustrated in FIG. 25, in the semiconductor device according to the embodiment 2, there is formed the element isolation unit DTI in which the element isolation unit DTIN with the narrow width is arranged in a predetermined position in the middle of the element isolation unit DTIW with the wide width extending in one direction. As illustrated in FIG. 26, the element isolation unit DTIW penetrates through the silicon oxide film HMF, and is formed in the trench TRCW reaching a predetermined width from the surface of the semiconductor substrate SUB.

The element isolation unit DTIN penetrates through the silicon oxide film HMF, and is formed in the trench TRCN reaching a predetermined width from the surface of the semiconductor substrate SUB. The element isolation unit DTIW includes a sidewall oxide film SW, a titanium film TF, a titanium nitride film TNF, and a tungsten film WF.

The element isolation unit DTIN includes a sidewall oxide film SW, a titanium film TF, a titanium nitride film TNF, and a tungsten film WF. The tungsten film WF is formed to close the opening end of the trench TRCN, at the opening end of the trench TRCN with the narrow width WN. The plug PG1 is formed to be in contact with the tungsten film WF for closing the opening end of the trench TRCN. Any other structures are the same as those of the semiconductor device according to the embodiment 1. The same members are identified by the same reference symbols, and will not repeatedly be described, unless otherwise necessary.

The manufacturing method of the above-described semiconductor device is realized by the same manufacturing method described in the embodiment 1, except that the pattern of the trench TRC is different from that of the semiconductor device according to the embodiment 1. Thus, descriptions will briefly be made thereto.

After a semiconductor element, such as a bipolar transistor BTR, is formed on the semiconductor substrate SUB, the trench TRC is formed in the same process as the process illustrated in FIG. 6. The trench TRN with a narrow width is formed in a predetermined position in the trench TRCW with a narrow width extending in one direction (see FIG. 25).

Next, through the same processes as those illustrated in FIG. 7 to FIG. 12, the element isolation unit DTIW is formed in the trench TRCW with a wide width, while the element isolation unit DTIN is formed in the trench TRN with a narrow width (see FIG. 26). At this time, in the trench TRCW with the wide width WW, the tungsten film WF is sufficiently formed on the bottom surface of the trench TRCW. In the trench TRCN with the narrow width WN, the tungsten film WF is formed to close the opening end of the trench TRCN (see FIG. 26).

Electric coupling is made between a part of the tungsten WF formed on the bottom surface of the trench TRCW and a part of the tungsten film WF formed to close the opening end of the trench TRCN, by a part of the tungsten film WE formed therebetween.

Through the same processes as those illustrated in FIG. 10 and FIG. 11, the element isolation unit DTI is formed in the trench TRC. At this time, there remains the tungsten film WF formed to close the opening end of the trench TRCN, at the opening end of the trench TRCN. The gap VID generated in the trench TRCW may be exposed at the opening end of the trench TRCW.

Through the same processes as those illustrated in FIG. 13 and FIG. 14, there are formed the plug PG1 in contact with the tungsten film WF formed in the trench TRCN and the plugs PG2, PG3, and PG4 in contact with the bipolar transistor (see FIG. 26). After this, a multilayer wiring structure is formed, and the main parts of the semiconductor device illustrated in FIG. 26 are completed.

In the above-described semiconductor device, like the above semiconductor device, the tungsten film WF is formed to close the opening end of the trench TRCN, in the trench TRCN with the narrow width. Thus, even after an etch back process is performed for the tungsten film, it is possible to prevent that the gap generated in the trench TRCN is exposed.

The tungsten film WF formed in the trench TRCN is coupled to the tungsten film WF formed in the trench TRCW. The tungsten film WF formed in the trench TRCW is formed surely on the bottom surface of the trench TRCW with the wide width, and is electrically coupled to the semiconductor substrate SUB.

As a result, it is possible to electrically couple the plug PG1 to which a predetermined potential is applied surely to the semiconductor substrate SUB, by forming the plug PG1 right above the tungsten film WF formed in the trench TRCN, without forming any additional lead-out electrode.

Further, in the above-described semiconductor device, there is formed the element isolation unit DTI in which the element isolation unit DTIN with the narrow width is arranged in a predetermined position in the middle of the element isolation unit DTIW with the wide width extending in one direction. By so doing, as compared with the semiconductor device according to the embodiment 1, it is possible to use, as the original element formation region, an area in which the narrow width element isolation unit DTIN is formed in the element formation region, in a direction in which the element isolation unit DTIW extends, from the wide width element isolation unit DTIW. For example, it is possible to eliminate restriction on the pattern of the element formation region, caused by forming the narrow width element isolation unit DTIN in the element formation region.

In the above descriptions, the values of the trenches TRCW and TRCN, the value of the film thickness of the sidewall oxide film SW, and the value of the film thickness of the tungsten film WF are given only by way of example, and are not limited to the above examples.

The following condition is required to surely form the tungsten film on the bottom surface of the trench TRCW with the wide width and to form the tungsten film WF to surely close the opening end of the trench TRCN with the narrow width. The relationship between a film thickness T and a width WN is preferably "width WN/2≤film thickness T≤width WN", when the width of the wide width trench TRCW is expressed by WW, the width of the narrow width trench TRCN is expressed by WN, and the thickness of the tungsten film is expressed by T. The relationship between the film thickness T and a width WW is preferably "film thickness T≤width WW/2".

For the semiconductor device SCD described in each of the above embodiments, various combinations are possible as needed.

Accordingly, the descriptions have specifically been made to the inventions made by the present inventors, based on the preferred embodiments. However, the present invention is not limited to the above-described embodiments. Various changes may possibly be made without departing from the scope thereof.

What is claimed is:

1. A semiconductor device comprising:
a semiconductor substrate;
an element isolation unit which is formed in the semiconductor substrate;
an element formation region which is defined by the element isolation unit;
an insulating film which is formed to cover the element formation region; and
a contact unit which penetrates through the insulating film and is formed in contact with the element isolation unit,
wherein the element isolation unit includes
a first element isolation unit which reaches a first depth from a surface of the semiconductor substrate and has a first width, and
a second element isolation unit which reaches the first depth from the surface of the semiconductor substrate and has a second width narrower than the first width,
wherein the first element isolation unit includes a first conductor unit which is electrically coupled to the semiconductor substrate at a lower end of the first element isolation unit,
wherein the second element isolation unit includes a second conductor unit in contact with the first conductor unit, and
wherein the contact unit is in contact with the second conductor unit.

2. The semiconductor device according to claim 1, wherein, in the element isolation unit, when a ratio of the first depth to a width of the element isolation unit is an aspect ratio, the aspect ratio is 7.5 or greater.

3. The semiconductor device according to claim 1, wherein the second conductor unit is positioned at an upper end of the second element isolation unit.

4. The semiconductor device according to claim 3, wherein the second conductor unit and the contact unit are arranged to overlap in plan view.

5. The semiconductor device according to claim 1, wherein the first element isolation unit is formed to surround the element formation region, in a form including a part extending in a first direction, and
wherein the second element isolation unit is formed in a second direction intersecting the first direction from a part of the first element isolation unit extending in the first direction.

6. The semiconductor device according to claim 1, wherein the first element isolation unit is formed to surround the element formation region, in a form including a part extending in a first direction, and
wherein the second element isolation unit is formed along the first direction in a predetermined position in the first element isolation unit extending in the first direction.

* * * * *